(12) United States Patent
Zhao

(10) Patent No.: US 8,847,212 B2
(45) Date of Patent: Sep. 30, 2014

(54) OLED DEVICE

(75) Inventor: Xiaohu Zhao, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 200 days.

(21) Appl. No.: 13/639,204

(22) PCT Filed: Aug. 14, 2012

(86) PCT No.: PCT/CN2012/080112
§ 371 (c)(1),
(2), (4) Date: Oct. 4, 2012

(87) PCT Pub. No.: WO2014/015544
PCT Pub. Date: Jan. 30, 2014

(65) Prior Publication Data
US 2014/0027718 A1    Jan. 30, 2014

(30) Foreign Application Priority Data

Jul. 27, 2012    (CN) .......................... 201210264174

(51) Int. Cl.
*H01L 35/24*    (2006.01)

(52) U.S. Cl.
USPC ..................................... 257/40; 257/E51.001

(58) Field of Classification Search
USPC ............................................. 257/40, E51.001
See application file for complete search history.

(56) References Cited

U.S. PATENT DOCUMENTS

2006/0216814 A1*    9/2006    Kobayashi et al. ........ 435/287.2

* cited by examiner

*Primary Examiner* — Anthony Ho
(74) *Attorney, Agent, or Firm* — Kirton McConkie; Evan R. Witt

(57) ABSTRACT

An OLED device comprises an anode, a hole transport layer, a luminance layer, an electron transport layer and a cathode. Molecules of film materials of forming the carrier transport layer all stand upright on the electrodes. A long axis of the molecule is perpendicular to the electrodes. There forms vertical conjugated planes between the molecules of each molecule layer in the film. These conjugated planes are parallel to each other and perpendicular to the electrodes. Therefore, the carrier transportation of the OLED device of the present invention mainly relies on the conjugated bonds in the molecules, but not the transition between the molecules, thereby efficiently improving the carrier mobility, reducing the working pressure and the power consumption of the OLED device, and improving the performance of the OLED device.

15 Claims, 5 Drawing Sheets

OLED DEVICE

BACKGROUND OF THE INVENTION

1. Field of the Invention

The present invention relates to an OLED technical field, and more particularly to an OLED device, in which the molecular conjugated planes of carrier transport layers are parallel to each other and stand upright on electrodes.

2. Description of the Prior Art

An OLED (Organic Light-Emitting Diode) has become a new generation of a flat panel display technology. It does not need a backlight, and adopts a very thin coating of organic material and a glass substrate. When supplying a current to the OLED, the organic material will emit light.

Please refer to FIG. 1, a conventional OLED device 9 includes an anode 91, a hole transport layer 93, a luminance layer 94, an electron transport layer 95 and a cathode 97. Electrons are injected into the electron transport layer 95 from the cathode 97, and positive holes are injected into the hole transport layer 93 from the anode 91. The injected electrons and holes recombine in the luminance layer 94 to emit light. For improving the performance of the OLED device 9, usually a hole injection layer 92 is inserted between the anode 91 and the hole transport layer 93 to be convenient for the holes to be injected into the hole transport layer 93, and an electron injection layer 96 is inserted between the electron transport layer 95 and the cathode 97 for greatly reducing the energy barrier between the cathode 97 and the electron transport layer 95 and reducing the drive pressure.

Presently, the carrier transport layers of the OLED device are amorphous films formed by an evaporation source being heated to evaporate and then being condensed on the electrode. This kind of the amorphous films transports the carriers by the carrier transition between the molecules, so the molecular structure in the films is an important factor restricting the carriers.

Please refer to FIGS. 2 to 4, FIG. 2 is a molecular structure of the film material of the carrier transport layer 93(95) of the prior OLED device, FIG. 3 is a geometric shape schematic view of the molecular structure of FIG. 2, and FIG. 4 is a microstructure schematic view of the carrier transport layer 93(95) of the prior OLED device. The molecular structure of the film material of the carrier transport layer 93(95) of the prior OLED device has great conjugated bonds, is a rigid planar structure, and horizontally stacks on the electrode 91(97) to form a film having a certain thickness. This film is constructed by multiple molecule layers 90. Specifically, in the carrier transport layer 93(95) of the prior OLED device, a long axis 93 (as shown by FIG. 3) of the molecular structure in each molecule layer 90 is parallel to the electrode 91(97). Though each molecule layer 90 has a high conductivity due to the conjugated bonds, when transporting the carriers, because the transport direction A of the carriers is perpendicular to the long axis 98 of the molecular structure, the carriers must overcome the molecular attraction between the molecule layers 90 to complete the transition. Accordingly, the carrier-transporting ability of the carrier transport layer 93(95) of the prior OLED device mainly relies on the carrier transition between the molecule layers 90, but this kind of the carrier transport layer 93(95) is difficult to improve the carrier mobility.

Hence, it is necessary to provide a new OLED device to overcome above defect.

BRIEF SUMMARY OF THE INVENTION

The present invention provides an OLED device to solve the problems that a carrier mobility is difficult to be enhanced because of a carrier transport direction being perpendicular to a long axis of the molecular structure in the prior art.

A primary object of the present invention is to provide an OLED device, in which a long axis of the molecular structure of each molecule layer in carrier transport layers stands upright on an electrode, wherein the carrier transportation mainly relies on the conjugated bonds in the molecules, but not the transition between the molecules, thereby efficiently improving the carrier mobility, reducing the working pressure and the power consumption of the OLED device, and improving the performance of the OLED device.

The other object and the advantage of the present invention may be further understood from the technical features disclosed by the present invention.

To achieve the aforementioned object or other objects of the present invention, the present invention adopts the following technical solution.

An OLED device comprises an anode, a hole transport layer, a luminance layer, an electron transport layer and a cathode, wherein the hole transport layer, the luminance layer, the electron transport layer and the cathode are orderly formed on the anode by a vacuum thermal evaporation and all have a certain thickness. Molecules of a film material of forming the hole transport layer all stand upright on the anode, there forms vertical conjugated planes between the molecules of each molecule layer in the hole transport layer, and the conjugated planes are parallel to each other and perpendicular to the anode. Molecules of a film material of forming the electron transport layer all stand upright on the cathode, there forms vertical conjugated planes between the molecules of each molecule layer in the electron transport layer, these conjugated planes are parallel to each other and perpendicular to the cathode.

In one embodiment of the present invention, the molecules of the film materials of forming the hole transport layer and the electron transport layer all have great conjugated bonds and a rigid planar structure.

In one embodiment of the present invention, a long axis of each molecule of the film materials of forming the hole transport layer and the electron transport layer is perpendicular to the anode and the cathode.

In one embodiment of the present invention, the hole transport layer and the electron transport layer are formed by an organic material evaporation.

In one embodiment of the present invention, the OLED device further comprises a hole injection layer located between the anode and the hole transport layer, and an electron injection layer located between the cathode and the electron transport layer.

In one embodiment of the present invention, both the hole injection layer and the electron injection layer adopt the same film structure as the hole transport layer and the electron transport layer.

In one embodiment of the present invention, the hole injection layer is individually formed by the evaporation, or is formed by the evaporation after being mixed with the material of the hole transport layer.

In one embodiment of the present invention, the electron injection layer is individually formed by the evaporation, or is formed by the evaporation after being mixed with the material of the electron transport layer.

To achieve the aforementioned object or other objects of the present invention, the present invention also adopts the following technical solution.

An OLED device comprises an anode, a hole transport layer, a luminance layer, an electron transport layer and a cathode, wherein the hole transport layer, the luminance layer, the electron transport layer and the cathode are orderly formed on the anode by a vacuum thermal evaporation and all have a certain thickness. Molecules of film materials of forming the hole transport layer and the electron transport layer all have great conjugated bonds and a rigid planar structure, and a long axis of each molecule is perpendicular to the anode and the cathode.

In one embodiment of the present invention, the molecules of the film material of forming the hole transport layer all stand upright on the anode, there forms vertical conjugated planes between the molecules of each molecule layer in the hole transport layer, and the conjugated planes are parallel to each other and perpendicular to the anode. The molecules of the film material of forming the electron transport layer all stand upright on the cathode, there forms vertical conjugated planes between the molecules of each molecule layer in the electron transport layer, and these conjugated planes are parallel to each other and perpendicular to the cathode.

To achieve the aforementioned object or other objects of the present invention, the present invention also adopts the following technical solution.

An OLED device comprises an anode, a hole injection layer, a hole transport layer, a luminance layer, an electron transport layer, an electron injection layer and a cathode, wherein the hole injection layer, the hole transport layer, the luminance layer, the electron transport layer, the electron injection layer and the cathode are orderly formed on the anode by a vacuum thermal evaporation and all have a certain thickness. Molecules of film materials of forming the hole injection layer, the hole transport layer, the electron transport layer and the electron injection layer all have great conjugated bonds and a rigid planar structure, and a long axis of each molecule is perpendicular to the anode and the cathode.

In one embodiment of the present invention, the molecules of the film material of forming the hole injection layer all stand upright on the anode, there forms vertical conjugated planes between the molecules of each molecule layer in the hole injection layer, and the conjugated planes are parallel to each other and perpendicular to the anode.

In one embodiment of the present invention, the molecules of the film material of forming the hole transport layer all stand upright on the hole injection layer, there forms vertical conjugated planes between the molecules of each molecule layer in the hole transport layer, and the conjugated planes are parallel to each other and perpendicular to the anode.

In one embodiment of the present invention, the molecules of the film material of forming the electron injection layer all stand upright on the cathode, there forms vertical conjugated planes between the molecules of each molecule layer in the electron injection layer, and these conjugated planes are parallel to each other and perpendicular to the cathode.

In one embodiment of the present invention, the molecules of the film material of forming the electron transport layer all stand upright on the electron injection layer, there forms vertical conjugated planes between the molecules of each molecule layer in the electron transport layer, and these conjugated planes are parallel to each other and perpendicular to the cathode.

Comparing with the prior art, the OLED device of the present invention employs the carrier transport layers, in which the long axis of the molecule stands upright on an electrode, wherein the carrier transportation mainly relies on the conjugated bonds in the molecules, but not the transition between the molecules, thereby efficiently improving the carrier mobility, reducing the working pressure and the power consumption of the OLED device, and improving the performance of the OLED device.

DETAILED DESCRIPTION OF THE PREFERRED EMBODIMENTS

The following description of every embodiment with reference to the accompanying drawings is used to exemplify a specific embodiment, which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention.

Figure 5:
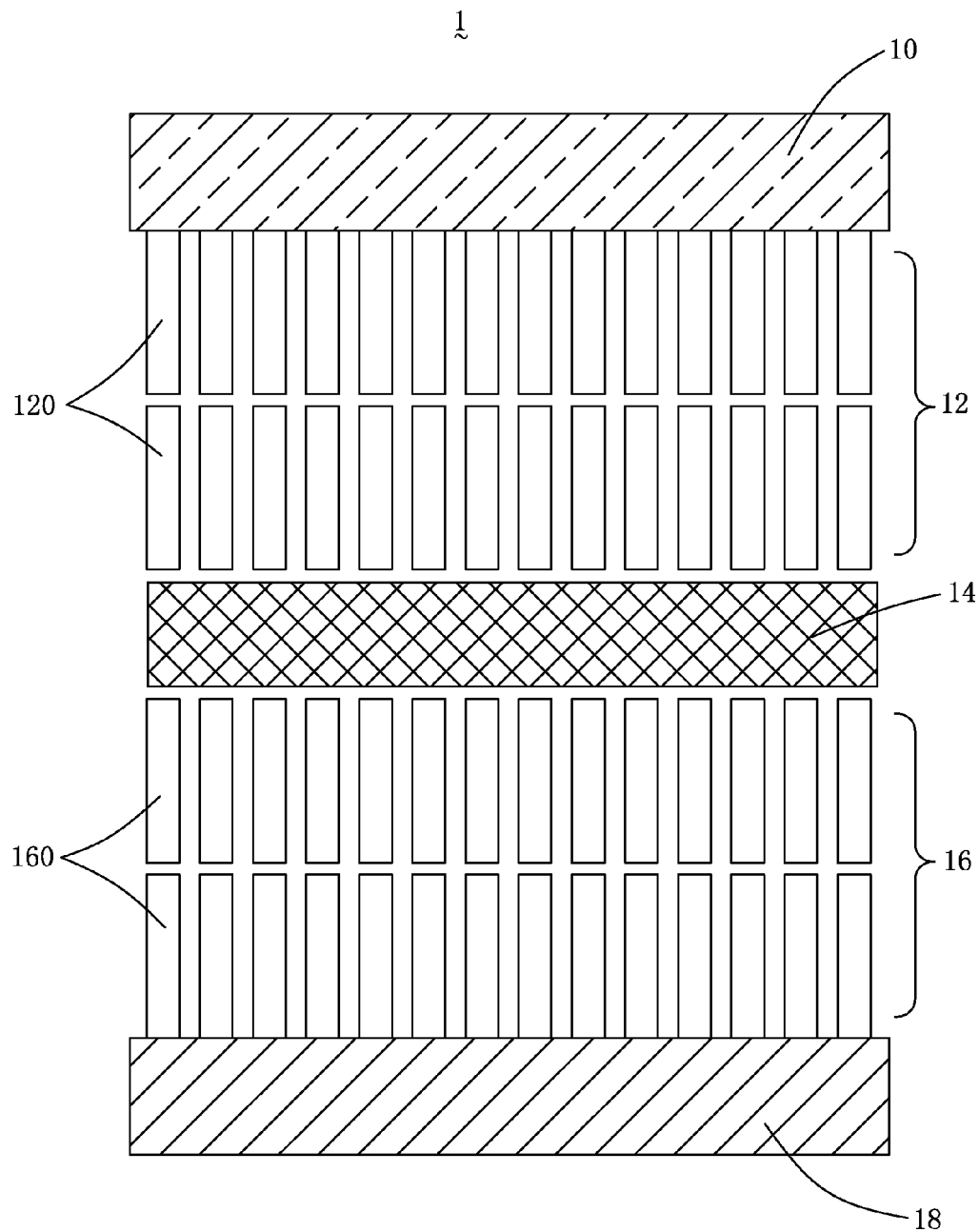
FIG. 5 is a structure schematic view of a preferred embodiment of an OLED device of the present invention, and stressly shows a microstructure schematic view of carrier transport layers.

Please refer to FIG. 5, an OLED device 1 of the present invention mainly comprises an anode 10, a hole transport layer 12, a luminance layer 14, an electron transport layer 16 and a cathode 18, wherein the hole transport layer 12, the luminance layer 14, the electron transport layer 16 and the cathode 18 are orderly formed onto the anode 10 by a vacuum thermal evaporation, and all have a certain thickness. Wherein molecules of material of forming the electron transport layer 16 have great conjugated bonds and a rigid planar structure, and are upright stacked on the cathode 18 to form a film having the certain thickness Similarly, molecules of film material of forming the hole transport layer 12 also stand upright on the anode 10.

As shown in FIG. 5, a long axis of each molecule of the film materials forming the hole transport layer 12 and the electron transport layer 16 is perpendicular to the anode 10 and the cathode 18. Therefore, the carrier transportation of the OLED device 1 of the present invention may rely on the conjugated bonds of the molecules of the film materials, but not the transition between the molecules, thereby improving the carrier mobility.

Moreover, the carrier transport layers (the hole transport layer 12 and the electron transport layer 16) of the OLED device 1 of the present invention can make the molecules of the film materials stand upright on the electrodes (the anode 10 and the cathode 18) under the condition of no changing the planar structure of the molecule, so that there forms great vertical conjugated planes between the molecules of each molecule layer 120, 160 in the film layers. These conjugated planes are parallel to each other and perpendicularly stand on the electrodes 10 and 18, so that the carriers can be transported on the conjugated planes.

Comparing the carrier transport layers 12, 16 of the OLED device 1 of the present invention and the carrier transport layers 93, 95 of the OLED device 9 of the prior art, under the condition of the same film thickness, the number of the molecule layers in the carrier transport layers 12, 16 of the OLED device 1 of the present invention is less, so that further reducing the carrier transition between the molecules and improving the carrier mobility.

Figure 1:
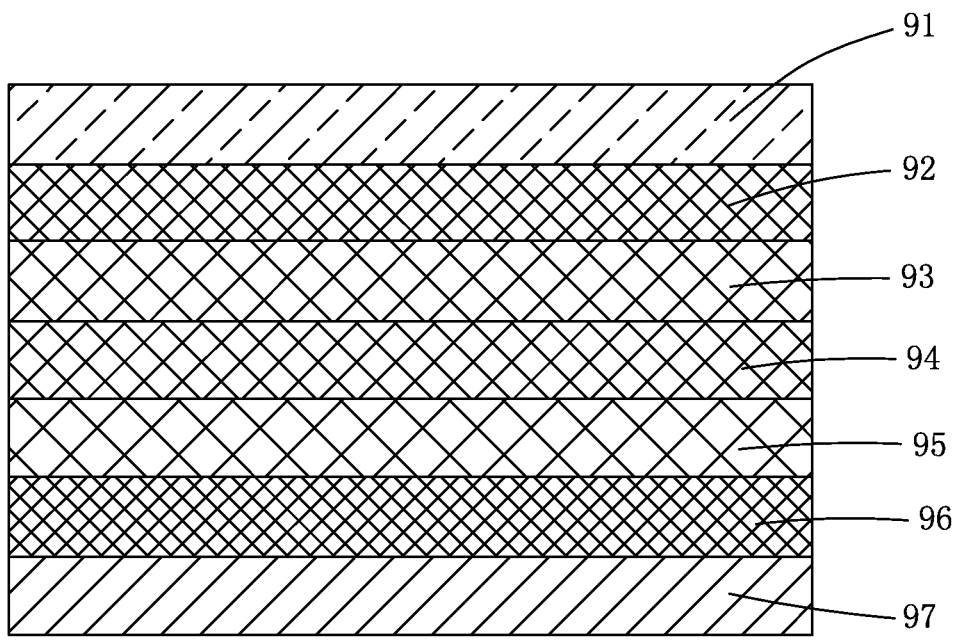
FIG. 1 is a structure schematic view of an OLED device of the prior art.
Figure 2:
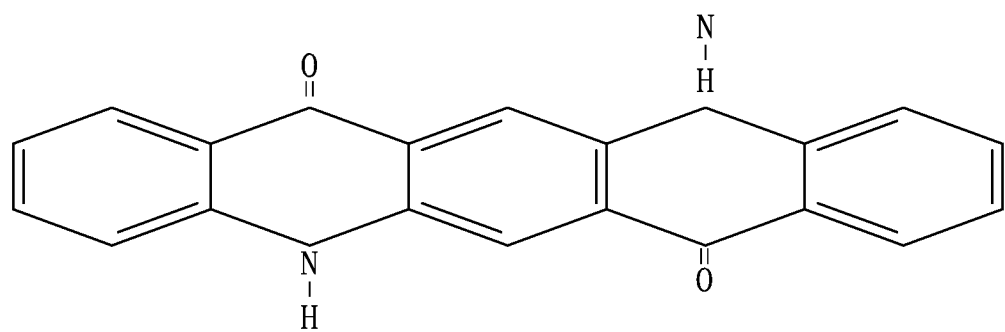
FIG. 2 is a molecular structure of the film material of carrier transport layers of the prior OLED device.
Figure 6:
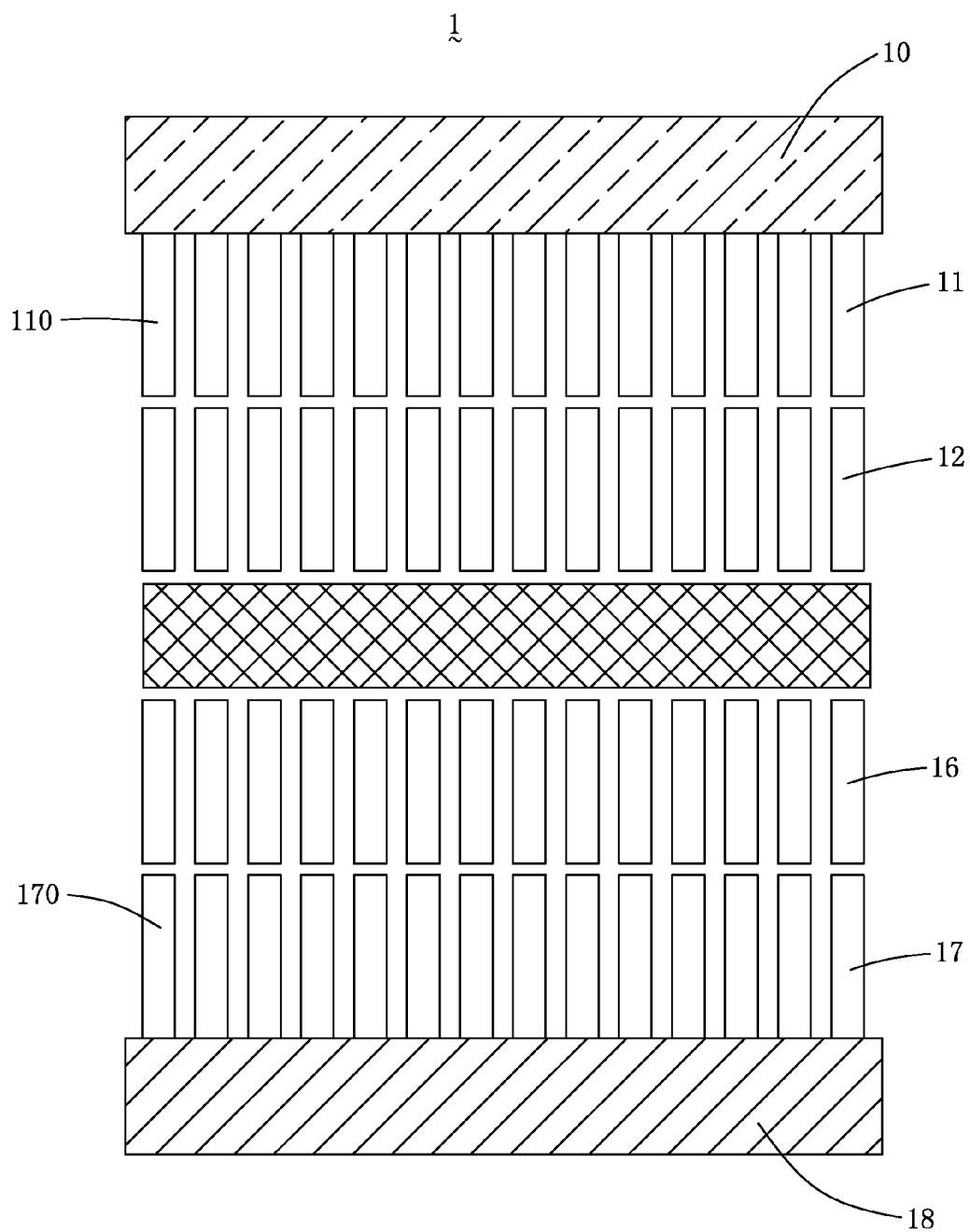
FIG. 6 is a structure schematic view of another embodiment of the OLED device of the present invention, wherein the film structure thereof is generally similar to that in FIG. 5, but the meanings of some films of FIG. 6 are different from those in FIG. 5.

Please refer to another embodiment of the OLED device 1 of the present invention shown by FIG. 6, the OLED device 1 of the present invention further comprises a hole injection layer 11 and an electron injection layer 17, wherein the hole injection layer 11 is located between the anode 10 and the hole transport layer 12, and the electron injection layer 17 is located between the cathode 18 and the electron transport layer 16, thereby further improving the carrier mobility. The location relation of the hole injection layer 11 and the electron injection layer 17 is similar to that of the hole injection layer 92 and the electron injection layer 96 shown in FIG. 1. The hole injection layer 11 and the electron injection layer 17 of the OLED device 1 of the present invention adopt the same film structure as the hole transport layer 12 and the electron transport layer 16. Namely, there forms vertical conjugated planes between the molecules of each molecule layer 110, 170 of the film materials of forming the hole injection layer 11 and the electron injection layer 17, and these conjugated planes are parallel to each other and perpendicular to the electrodes 10, 18.

Furthermore, the hole injection layer 11 of the OLED device 1 of the present invention may be individually formed by the evaporation, or be formed by the evaporation after being mixed with the material of the hole transport layer 12. Similarly, the electron injection layer 17 of the OLED device 1 of the present invention also may be individually formed by the evaporation, or be formed by the evaporation after being mixed with the material of the electron transport layer 16.

The carrier transport layers 12, 16 of the OLED device 1 of the present invention are formed by an organic material evaporation, and the organic molecule may be biphenyl and its derivatives.

The luminance layer 14 of the OLED device 1 of the present invention does not adopt above film structure, but still adopts a molecular horizontal stacking mode.

Figure 3:
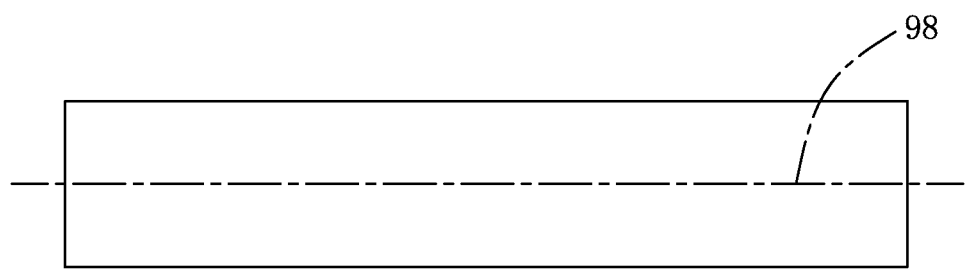
FIG. 3 is a geometric shape schematic view of the molecular structure of FIG. 2.
Figure 4:
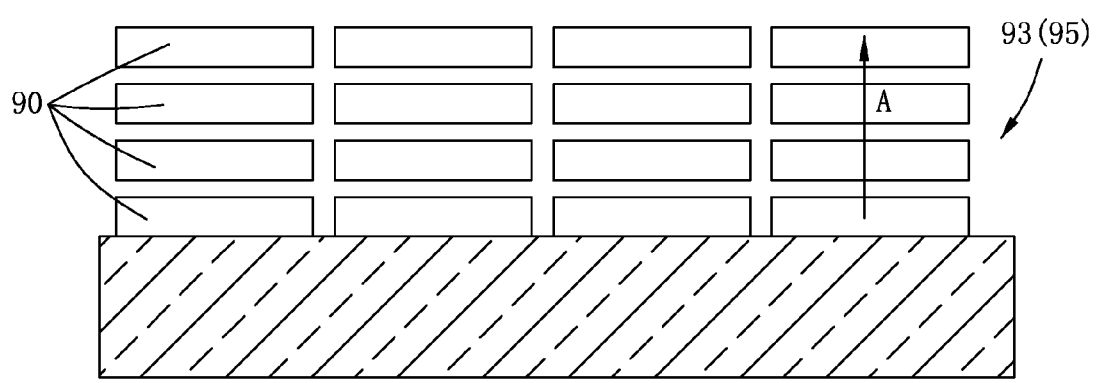
FIG. 4 is a microstructure schematic view of the carrier transport layers of the prior OLED device.

In conclusion, the long axis 98 (shown in FIG. 3) of the molecule of the carrier transport layers 12, 16 of the OLED device 1 of the present invention stands upright on the electrodes 10, 18. The carrier transportation mainly relies on the conjugated bonds in the molecules, but not the transition between the molecules, thereby efficiently improving the carrier mobility, reducing the working pressure and the power consumption of the OLED device, and improving the performance of the OLED device.

The present invention has been illustrated by the above embodiments, but the above embodiments only are used as examples for implementing the present invention. It must need to be pointed out that the exposed embodiments cannot limit the scope of the present invention. Oppositely, the modification and equivalent structures included within the spirit and scope of the appended claims are also included within the scope of the present invention.

What is claimed is:

1. An OLED device, comprising: an anode, a hole transport layer, a luminance layer, an electron transport layer and a cathode, wherein the hole transport layer, the luminance layer, the electron transport layer and the cathode are orderly formed on the anode by a vacuum thermal evaporation and all have a certain thickness; wherein
    molecules of a film material of forming the hole transport layer all standing upright on the anode, there forming vertical conjugated planes between the molecules of each molecule layer in the hole transport layer, and the conjugated planes being parallel to each other and perpendicular to the anode; and
    molecules of a film material of forming the electron transport layer all standing upright on the cathode, there forming vertical conjugated planes between the molecules of each molecule layer in the electron transport layer, and these conjugated planes being parallel to each other and perpendicular to the cathode.

2. The OLED device as claimed in claim 1, wherein the molecules of the film materials of forming the hole transport layer and the electron transport layer all have great conjugated bonds and a rigid planar structure.

3. The OLED device as claimed in claim 2, wherein a long axis of each molecule of the film materials of forming the hole transport layer and the electron transport layer is perpendicular to the anode and the cathode.

4. The OLED device as claimed in claim 1, wherein the hole transport layer and the electron transport layer are formed by an organic material evaporation.

5. The OLED device as claimed in claim 1, wherein the OLED device further comprises a hole injection layer, which is located between the anode and the hole transport layer, and an electron injection layer, which is located between the cathode and the electron transport layer.

6. The OLED device as claimed in claim 1, wherein both the hole injection layer and the electron injection layer adopt the same film structure as the hole transport layer and the electron transport layer.

7. The OLED device as claimed in claim 1, wherein the hole injection layer is individually formed by the evaporation, or is formed by the evaporation after being mixed with the material of the hole transport layer.

8. The OLED device as claimed in claim 1, wherein the electron injection layer is individually formed by the evaporation, or is formed by the evaporation after being mixed with the material of the electron transport layer.

9. An OLED device, comprising: an anode, a hole transport layer, a luminance layer, an electron transport layer and a cathode, wherein the hole transport layer, the luminance layer, the electron transport layer and the cathode are orderly formed on the anode by a vacuum thermal evaporation and all have a certain thickness; wherein
    molecules of film materials of forming the hole transport layer and the electron transport layer all having great conjugated bonds and a rigid planar structure, and a long axis of each molecule being perpendicular to the anode and the cathode.

10. The OLED device as claimed in claim 9, wherein the molecules of the film material of forming the hole transport layer all stand upright on the anode, there forms vertical conjugated planes between the molecules of each molecule layer in the hole transport layer, the conjugated planes are parallel to each other and perpendicular to the anode; and
    the molecules of the film material of forming the electron transport layer all stand upright on the cathode, there forms vertical conjugated planes between the molecules of each molecule layer in the electron transport layer, these conjugated planes are parallel to each other and perpendicular to the cathode.

11. An OLED device, comprising: an anode, a hole injection layer, a hole transport layer, a luminance layer, an electron transport layer, an electron injection layer and a cathode, wherein the hole injection layer, the hole transport layer, the luminance layer, the electron transport layer, the electron injection layer and the cathode are orderly formed on the anode by a vacuum thermal evaporation and all have a certain thickness; wherein molecules of film materials of forming the hole injection layer, the hole transport layer, the electron transport layer and the electron injection layer all having great conjugated bonds and a rigid planar structure, and a long axis of each molecule being perpendicular to the anode and the cathode.

12. The OLED device as claimed in claim 11, wherein the molecules of the film material of forming the hole injection layer all stand upright on the anode, there forms vertical conjugated planes between the molecules of each molecule layer in the hole injection layer, and the conjugated planes are parallel to each other and perpendicular to the anode.

13. The OLED device as claimed in claim 12, wherein the molecules of the film material of forming the hole transport layer all stand upright on the hole injection layer, there forms vertical conjugated planes between the molecules of each molecule layer in the hole transport layer, and the conjugated planes are parallel to each other and perpendicular to the anode.

14. The OLED device as claimed in claim 11, wherein the molecules of the film material of forming the electron injection layer all stand upright on the cathode, there forms vertical conjugated planes between the molecules of each molecule layer in the electron injection layer, and these conjugated planes are parallel to each other and perpendicular to the cathode.

15. The OLED device as claimed in claim 14, wherein the molecules of the film material of forming the electron transport layer all stand upright on the electron injection layer, there forms vertical conjugated planes between the molecules of each molecule layer in the electron transport layer, and these conjugated planes are parallel to each other and perpendicular to the cathode.

* * * * *